United States Patent
Perndl

(10) Patent No.: US 10,180,458 B2
(45) Date of Patent: Jan. 15, 2019

(54) MEASURING SYSTEM AND MEASURING METHOD WITH POWER CALIBRATION

(71) Applicant: Rohde & Schwarz GmbH & Co. KG, Munich (DE)

(72) Inventor: Werner Perndl, Zorneding (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 40 days.

(21) Appl. No.: 14/941,317

(22) Filed: Nov. 13, 2015

(65) Prior Publication Data
US 2016/0334442 A1    Nov. 17, 2016

Related U.S. Application Data

(60) Provisional application No. 62/161,354, filed on May 14, 2015.

(51) Int. Cl.
| | | |
|---|---|---|
| G01R 31/317 | (2006.01) | |
| G01R 1/067 | (2006.01) | |
| G01R 21/133 | (2006.01) | |

(52) U.S. Cl.
CPC ... G01R 31/31721 (2013.01); G01R 1/06705 (2013.01); *G01R 21/133* (2013.01)

(58) Field of Classification Search
CPC ..................... G01R 31/3191; G01R 31/3194
See application file for complete search history.

(56) References Cited

U.S. PATENT DOCUMENTS

| | | | |
|---|---|---|---|
| 6,741,070 B2 | 5/2004 | Kodato | |
| 6,767,129 B2 | 7/2004 | Lee | |
| 7,705,582 B2 | 4/2010 | Noujeim | |
| 7,764,072 B2 | 7/2010 | Strid et al. | |
| 7,786,741 B2 | 8/2010 | Thies et al. | |
| 7,795,889 B2 | 9/2010 | Kolmhofer | |
| 2008/0018343 A1* | 1/2008 | Hayden | G01D 18/00 324/601 |
| 2009/0174415 A1* | 7/2009 | Verspecht | G01R 35/005 324/601 |
| 2011/0208467 A1* | 8/2011 | Tang | G01R 35/007 702/117 |

(Continued)

FOREIGN PATENT DOCUMENTS

| | | |
|---|---|---|
| DE | 102006022475 | 11/2007 |
| DE | 102008057607 | 5/2010 |
| EP | 2840598 | 2/2015 |

*Primary Examiner* — Noam Reisner
(74) *Attorney, Agent, or Firm* — Lee & Hayes, PLLC

(57) ABSTRACT

A measuring system for performing measurements on a device under test is provided. The measuring system comprises a measuring device, a probe connected to the measuring device, a power sensor and a positioning unit. The positioning unit is adapted to connect the probe to the power sensor in a first configuration and to the device under test in a second configuration. The measuring device is adapted to generate a first signal. The probe is adapted to supply the first signal to the power sensor and the first configuration and to supply the first signal to the device under test and the second configuration. The power sensor is adapted to determine the power of the first signal and the first configuration. The measuring device is adapted to regulate the power of the first signal in the second configuration based upon the power determined by the power sensor.

17 Claims, 4 Drawing Sheets

(56) References Cited

U.S. PATENT DOCUMENTS

2012/0126786 A1* 5/2012 Reichel .................. G01R 21/02
                                                   324/105
2015/0204962 A1* 7/2015 Ku ..................... G01R 31/2891
                                                   324/750.02
2015/0316411 A1* 11/2015 McCord .................... G01J 1/18
                                                   356/402

* cited by examiner

MEASURING SYSTEM AND MEASURING METHOD WITH POWER CALIBRATION

TECHNICAL FIELD

The invention relates to a measuring system and a measuring method for performing measurements on a device under test, especially for performing measurements with a power calibrated measuring signal.

BACKGROUND ART

For performing tests on devices under test, especially for measuring on individual devices on a wafer, the devices are usually contacted by using a probe comprising measuring tips. The probe is moved with regard to the device under test. The measuring tips contact contact pads on the surface of the device under test of the wafer. Now, a measurement can be performed. Such a measuring system is shown in the European patent application EP 2 840 598 A1.

Exemplary probes are shown in the documents U.S. Pat. Nos. 7,795,889 B2, 7,764,072 B2 and 7,786,741 B2.

When performing measurements on the device under test, it is important to know the exact power level of the measuring signal supplied to the device under test. An accurate power measurement usually though cannot be performed by the network analyzer performing the measurement. A dedicated power sensor is usually used. For example, the documents U.S. Pat. Nos. 6,741,070 B2, 7,705,582 B2 and 6,767,129 B2 show power measurement cells as used in such dedicated power sensors. Moreover, document DE 10 2008 057 607 A1 also shows an exemplary power measurement cell.

In order to determine the power level of the signal generated, for example by a network analyzer to be supplied to the device under test, usually the measuring probe is detached from the measuring device. The measuring device is then connected to the power sensor. The measuring device then generates the measuring signal and supplies it usually via coaxial cable to the power sensor, which determines the power of the measuring signal. Afterwards, the probe is reattached and measurements are performed with a now known power level. In order to increase accuracy, it is possible to model an influence of the probe on the measuring signal and accordingly modify the measuring signal.

Performing the above-mentioned process though requires a great deal of effort, since the detaching of the probe, the attaching of the power sensor and the reattaching of the probe are steps, which have to be performed manually and cannot be automated. Therefore, the step of performing a power calibration usually is only performed once at the beginning of a measurement series and not repeated later on. This leads to possibly inaccurate measuring results.

Also, the model based compensation of the influence of the measuring probe is notoriously inaccurate.

Accordingly, one object of the invention among others is to provide a measuring system and a measuring method, which allow for an accurate power calibration directly at the point at which the device under test is measured.

Also, another object of the invention is to achieve a low handling effort for the operator.

SUMMARY OF THE INVENTION

According to a first aspect of the invention, a measuring system for performing measurements on a device under test is provided. The measuring system comprises a measuring device, a probe connected to the measuring device, a power sensor and a positioning unit. The positioning unit is adapted to connect the probe to the power sensor in a first configuration and to the device under test in a second configuration. The measuring device is adapted to generate a first signal. The probe is adapted to supply the first signal to the power sensor and the first configuration and to supply the first signal to the device under test and the second configuration.

Preferably, the power sensor is adapted to determine the power of the first signal and the first configuration, and the measuring device is adapted to regulate the power of the first signal in the second configuration based upon the power determined by the power sensor. It is thereby possible to automatically perform a power calibration of the first signal provided to the device under test. A significant decrease in measuring effort and increase in measuring accuracy can thereby be reached.

According to a first preferred implementation form of the first aspect, the power sensor comprises coplanar contacts. The probe is adapted to contact the coplanar contacts of the power sensor in the first configuration and to contact coplanar contacts of the device under test in the second configuration. An especially accurate measuring is thereby possible.

According to a second preferred implementation form of the first aspect, the measuring device is adapted to perform a calibration of the power of the first signal to a pre-specified power value using the probe and the power sensor while being in the first configuration. The measuring device is then furthermore adapted to perform a measurement of a second signal generated by the device under test as a reaction to the first signal using the probe in the second configuration. A further increase of measuring accuracy is thereby possible.

According to a third preferred implementation form of the first aspect, the measuring system moreover comprises a device under test mount for holding the device under test, and a power sensor mount for holding the power sensor. The probe is mounted at a fixed location. The positioning unit is adapted to jointly move the device under test mount and the power sensor mount for connecting the probe to the power sensor in the first configuration and to the device under test and in the second configuration. An especially accurate contacting can thereby be achieved.

According to a first preferred implementation form of the third implementation form of the first aspect, the probe comprises at least two, especially two or three or four or five measuring tips. The power sensor also comprises at least two, especially two or three or four or five contact pads. The positioning unit is then adapted to jointly move the device under test mount and the power sensor mount for connecting the at least two measuring tips of the probe each to one of the at least two contact pads of the power sensor in the first configuration and for connecting the at least two measuring tips of the probe each to one of the at least two contact pads of the device under test in the second configuration. By using this set up, a number of signals can be measured simultaneously. Also, a further increase of measuring accuracy is possible.

According to a preferred implementation form of the third implementation form of the first aspect or the first implementation form of the third implementation form of the first aspect, the measuring system comprises at least one further probe which is adapted to be interchangeably mounted instead of the probe. The probe has a first measuring tip pitch and the at least one further probe has a second measuring tip pitch different from the first measuring tip pitch. The measuring system moreover comprises at least one further power sensor which is adapted to be interchangeably mounted instead of the power sensor. The power sensor has a first contact pad pitch and the at least one further power sensor has a second contact pad pitch different from the first contact pad pitch. The first measuring tip pitch is comparable to the first contact pad pitch and second measuring tip pitch is comparable to the second contact pad pitch. A measuring system is adapted to be adaptive to different contact pad pitches of contact pads of the device under test by mounting the probe or the at least one further probe and by mounting the power sensor or the further power sensor. A great adaptability of the measuring system can thereby be achieved.

According to a preferred implementation form of the first implementation form of the third implementation form of the first aspect or the third implementation form of the first aspect, a measuring tip pitch of the measuring tips of the probe is adaptable to different contact pad pitches of the device under test by moving the measuring tips of the probe. Moreover, in this case the contact pads of the power sensor comprise a tapering, allowing for a contacting of the contact pads of the power sensor with probes of different measuring tip pitch, by contacting the contact pads of the power sensor at different locations of the tapering. This alternative requires a more complicated probe and power sensor, but at the same time requires only a single probe and power sensor.

According to a further preferred implementation form of the first aspect, the measuring system further comprises a calibration standard unit comprising a set of calibration standards. The positioning unit is adapted to connect the probe successively to a plurality of calibration standards from the set of calibration standards in further configurations. The probe is adapted to successively supply calibration signals to the plurality of calibration standards in the further configurations. The measuring device is adapted to perform calibration measurements of signals received from the plurality of calibration standards and perform a calibration of the measuring device based upon the measurements of the signals received from the plurality of calibration standards. Thereby, it is possible to perform not only a power calibration, but also an S-parameter calibration.

According to a first preferred implementation form of the previous implementation form of the first aspect, the measuring system comprises a device under test mount for holding the device under test, a power sensor mount for holding the power sensor, and a calibration standard unit mount, for holding the calibration standard unit. The probe is mounted at a fixed location. The positioning unit is adapted to jointly move the device under test mount, the power sensor mount and the calibration standard unit mount, for connecting the probe to the power sensor in the first configuration, to the device under test in the second configuration, and to the plurality of calibration standards in the further configurations. A very accurate positioning of the probe is thereby possible.

According to a second aspect of the invention, a measuring method for performing measurements on a device under test, is provided. The method comprises connecting a probe to a power sensor in a first configuration, generating a first signal by a measuring device, supplying the first signal to a power sensor, determining the power of the first signal in the first configuration by the power sensor, connecting the probe to the device under test in a second configuration, generating the first signal, supplying the first signal to the device under test and regulating the power of the first signal in the second configuration based upon the power determined by the power sensor. It is thereby possible to perform very accurate measurements with minimal operator effort.

BRIEF DESCRIPTION OF THE DRAWINGS

Exemplary embodiments of the invention is now further explained by way of example only with respect to the drawings, in which.

DETAILED DESCRIPTION OF THE PREFERRED EMBODIMENTS

Figure 1:
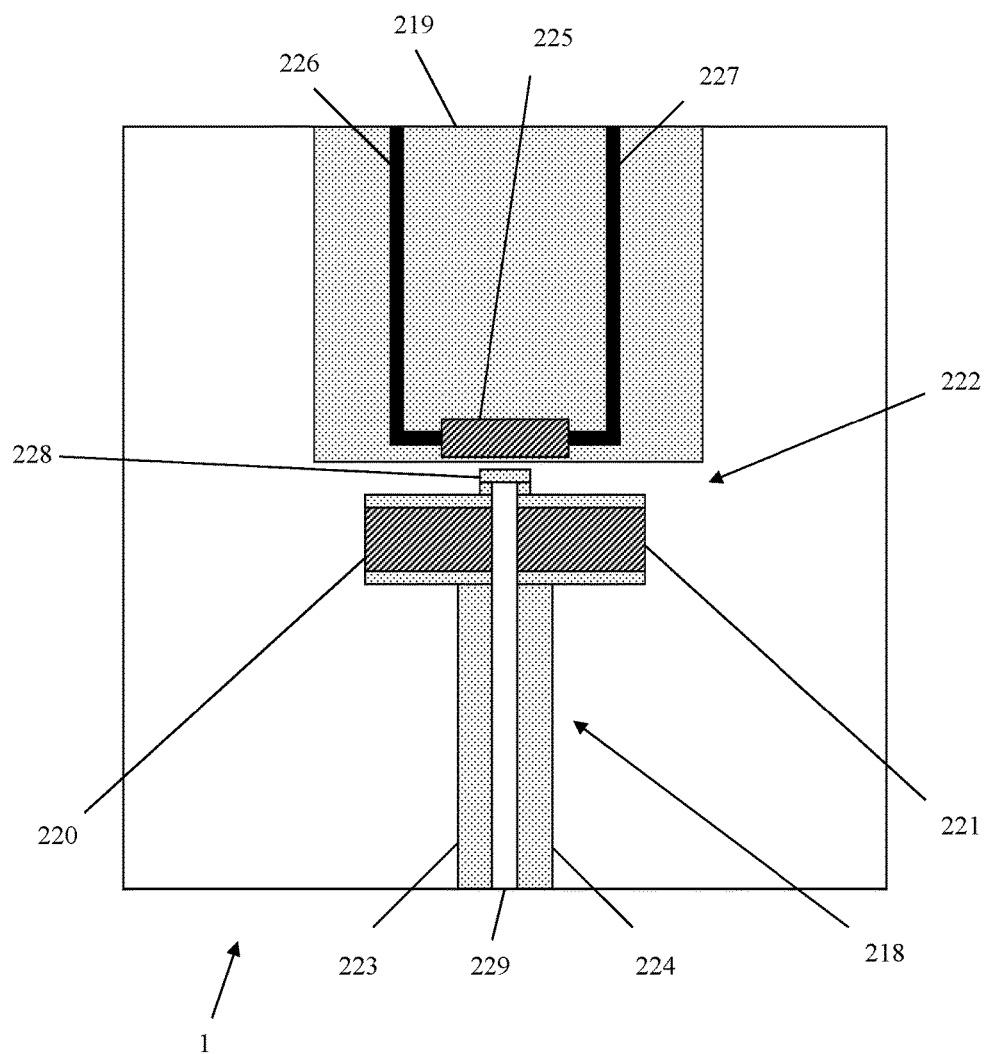
FIG. 1 shows an exemplary power sensor.

Firstly, we briefly show the construction of an exemplary power sensor along FIG. 1. Along FIG. 2 and FIG. 3, the construction and function of embodiments of the measuring system are described. Finally, along FIG. 4, the function of the measuring method is described. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

In FIG. 1, an exemplary power sensor, as shown by DE 10 2008 057 607 A1, is depicted. The power sensor 1 is a multi-layer structure on a substrate. A coplanar line 218 is formed from a middle line 229, three recesses 223, 224, 228 and a surrounding metallization. The coplanar line 218 is connected to two heating resistors 220, 221. The two resistors 220, 221 are connected on their side facing away from the coplanar line 218 to the surrounding metallization and accordingly to a ground connection. The two heating resistors 220, 221 accordingly form a common, grounded heating resistor. A first stripline 226 is connected to a third heating resistor 225. The side of the third heating resistor 225 facing away from the first stripline 226 is connected to a second stripline 227. The striplines 226, 227 and the heating resistor 225 are disposed within a recess 219 of the metallization. Other forms of lines can also be used instead of striplines and coplanar lines.

The structure described above is built up on the upper side of a silicon substrate. In this context, the heating resistors 220, 221, 225 are arranged in the centre of a membrane. A frame provides structural stability for the power-measurement cell. Furthermore, the frame is very strongly thermally coupled to a device housing, and accordingly represents an almost ideal temperature sink.

A measurement signal is fed in via the coplanar line 18. The measurement signal is grounded via the heating resistors 220, 221. The measurement signal accordingly heats the heating resistors 220, 221. The thermal power converted in the heating resistors is proportional to the power of the measurement signal. Since the heating resistors 220, 221 are attached to the above-mentioned membrane, the thermal power introduced cannot immediately dissipate. Instead, an equilibrium temperature of the membrane is established. The power of the measurement signal can be inferred from this equilibrium temperature.

This can be achieved by placing a number of thermocouples in a further layer on the membrane. A voltage across the thermocouples indicated the respective temperature.

Such a power sensor can perform very accurate power measurements, especially for high-frequency signals.

First Embodiment

Figure 2:
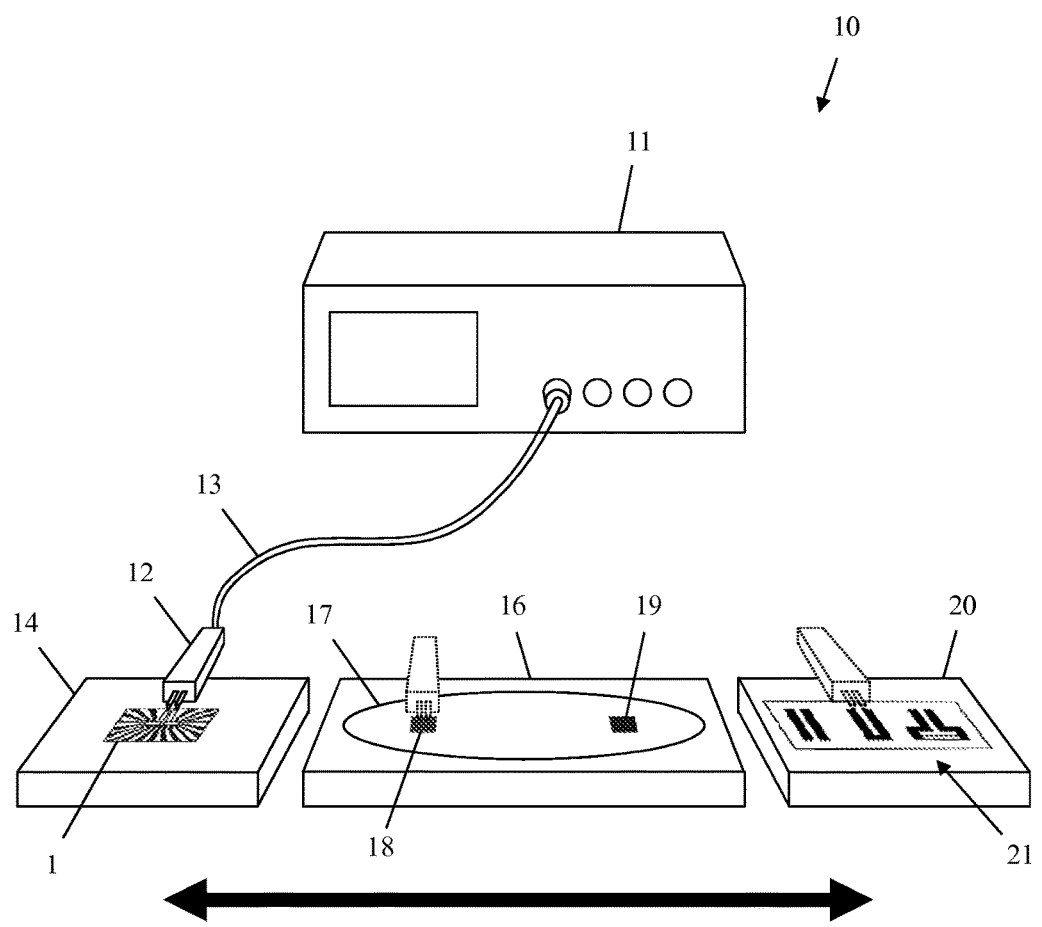
FIG. 2 shows a first embodiment of the measuring system according to the invention in a three dimensional overview.

In FIG. 2, an overview of an embodiment of the inventive measuring system 10 is shown. The measuring system 10 comprises a power sensor 1 as shown in FIG. 1. The power sensor 1 is held by a power sensor mount 14. Moreover, the measuring system 10 comprises a measuring device 11, which is connected via coaxial cable 13 to a probe 12. The probe 12 is a fixedly attached probe and not a handheld probe. In FIG. 2, the stand of the probe was omitted to enhance the clarity of the figure. The probe 12 has at least two measuring tips for contacting the contact pads 2, 3 of the power sensor 1. In this figure, the probe 12 presently contacts the power sensor 1.

The measuring tips of the probe 12 can have a GS, SG, GSG, GSGSG (G=ground, S=signal) configuration. Also, a multi-channel set up with a plurality of measuring tips is possible. It is thereby possible to contact a plurality of different coplanar connection types.

Moreover, the measuring system 10 comprises a device under test mount 16, which here is holding a wafer 17 comprising two devices under test 18, 19.

Optionally, the measuring system 10 can additionally comprise a calibration standard unit mount 20 holding a calibration standard unit 21 comprising a set of calibration standards, for example for performing an S-parameter calibration.

The power sensor mount 14, the device under test mount 16 and the calibration standard unit mount 20 have a fixed location with regard to each other. They can be moved jointly. At the same time, the probe 12 has a fixed position. For contacting the power sensor 1, the devices under test 18, 19 or the calibration standards of the calibration standard unit 21, the power sensor mount 14, the device under test mount 16 and the calibration standard unit mount 20 are jointly moved with regard to the probe 12. This is done by a positioning unit further described in FIG. 3.

Figure 3:
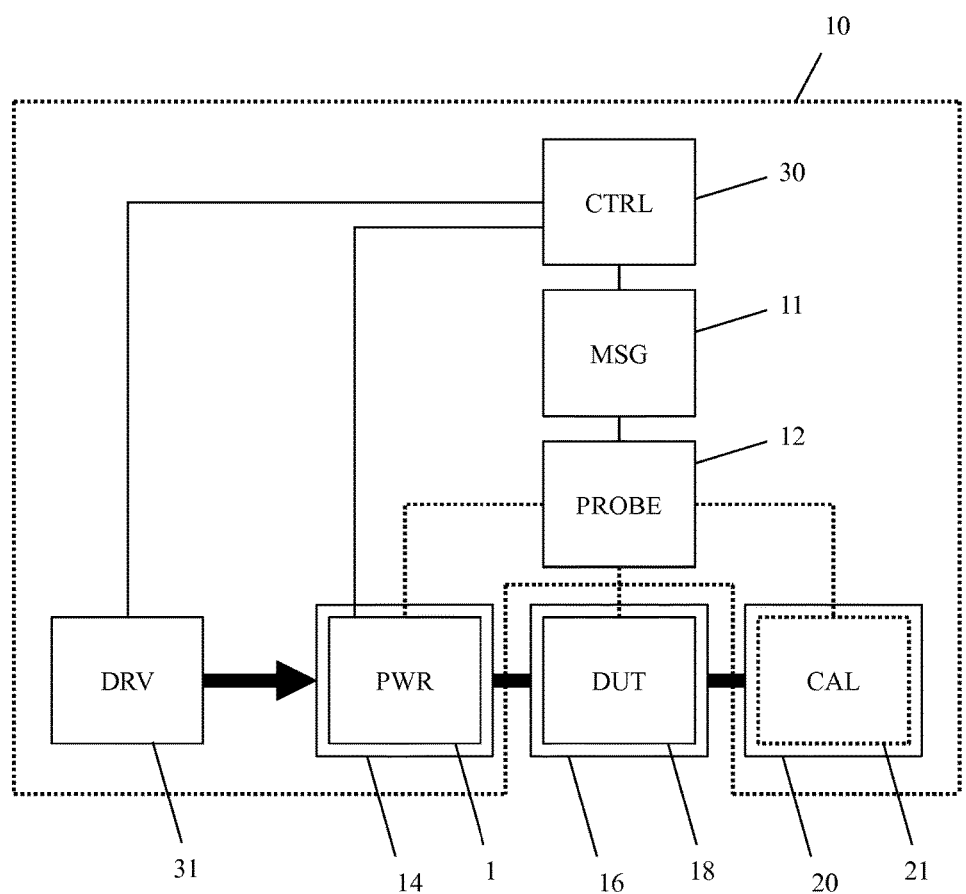
FIG. 3 shows a block diagram of a second embodiment of the system of the invention.

In FIG. 3, a block diagram of a further embodiment of the measuring system 10 is depicted. The measuring system 10 comprises a control unit 30 connected to a measuring device 11, to a positioning unit 31 and to a power sensor 1. The measuring device 11 is furthermore connected to a probe 12. The positioning unit 31 is connected to a power sensor mount 14, to a device under test mount 16, and to a calibration standard unit mount 20, which hold the power sensor 1, a device under test 18 and a calibration standard unit 21. The device under test 18 though is not part of the measuring system.

The positioning unit 31 is adapted to jointly move the power sensor mount 14, the device under test mount 16 and the calibration standard unit mount 20 with regard to the probe 12 and thereby contact the power sensor 1 by the probe 12 in a first configuration, the device under test 18 by the probe 12 in a second configuration, and successively contact a plurality of calibration standards from the calibration standard unit 21 with the probe in further configurations.

The control unit 30 is adapted to control the function of the measuring device 11, the positioning unit 31, and the power sensor 1. Especially, the control unit 30 is adapted to coordinate the movement of the power sensor mount 14, the device under test mount 16 and the optional calibration standard unit mount 20, the performing of the power measurement by the power sensor 1, the performing of the measurement by the measuring device 11 on the device under test 18, and the optional performing of calibration measurements by the measuring device 11 on the calibration standards of the calibration standard unit 21.

Second Embodiment

Figure 4:
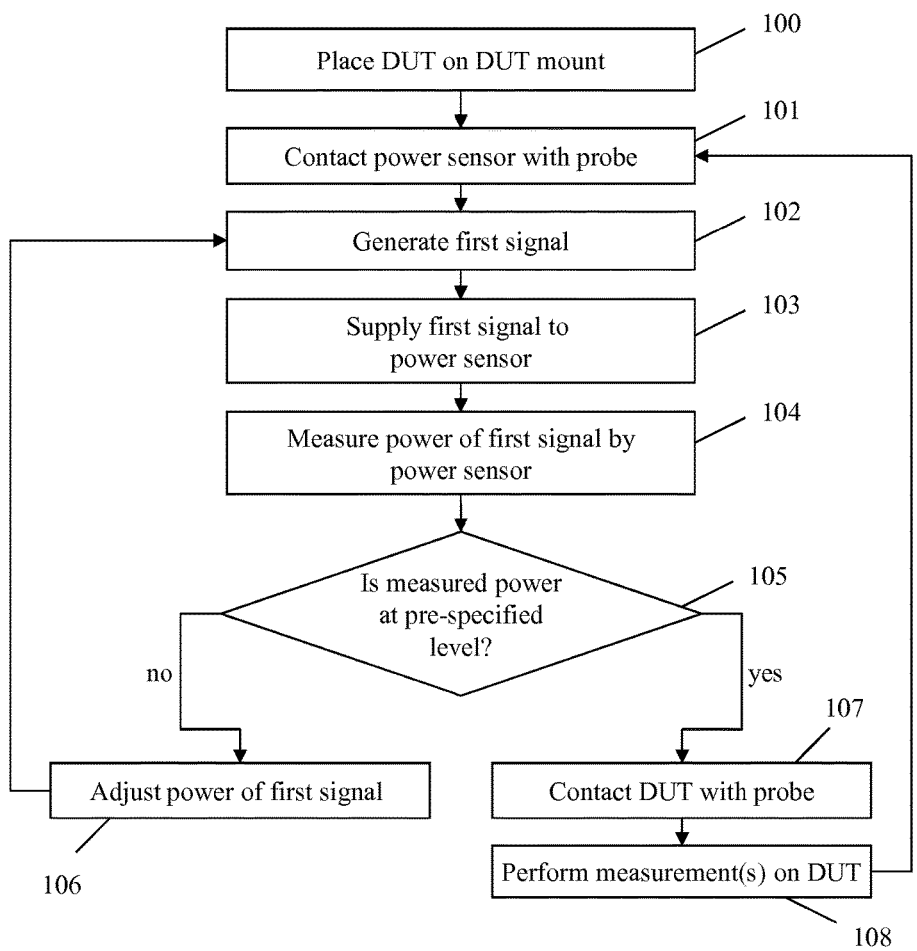
FIG. 4 shows an embodiment of the method of the invention in a flow diagram.

Finally, in FIG. 4, an embodiment of the measuring method is shown. In a first step 100, a device under test 18 is placed on the device under test mount 16. In a second step 101, the power sensor 1 is contacted with the probe 12. This is done by moving the power sensor mount 14 jointly with the device under test mount 16 and optionally the calibration standard unit mount 20 by the positioning unit 31.

In a third step 102, a first signal is generated by the measuring device 11. The first signal is supplied to the power sensor 1 in a fourth step 103 by the probe 12. In a fifth step 104, the power of the first signal is measured by the power sensor 1. In a sixth step 105, the control unit 30 determines, if the measured power of the first signal is at a pre-specified level.

If this is not the case, in a seventh step 106, the power level of the first signal is adjusted. It is then continued with the third step 103. If on the other hand, the measured power of the first signal is at the pre-specified level, in an eight step 107, the device under test 18 is contacted by the probe 12 by moving the power sensor mount 14, the device under test mount 16 and optionally the calibration standard unit mount 20 by the positioning unit 31 controlled by the control unit 30.

In a ninth step 108, measurements are now performed on the device under test 18. For these measurements, the measuring device 11 generates a measuring signal controlled by the control unit 30. The signal is provided to the device under test 18 via the probe 12. A resulting second signal generated by the device under test is provided to the measuring device 11 by the probe 12 and measured. One or more measurements can be performed in the ninth step 108. Optionally measurements on two or more DUTs can successively be performed during the ninth step 108. After the ninth step is complete, a new power calibration can be started in the second step 101. Alternatively, the measurement can be terminated.

Optionally, in addition to a power calibration, also an S-parameter calibration using the calibration standard unit 21 can be performed. In this case, the probe 12 contacts successively a plurality of calibrations standards of the calibration standard unit 21 and the measuring device 12 performs calibration measurements on each of them. An S-parameter calibration is then performed by the measuring device 11 based upon the calibration measurements.

It is important to note that with the measuring system and method according to the present invention, it is possible to accurately determine the power supplied to the device under test directly at the planar interface, on-wafer.

Especially for symmetric signals, probes with at least two measuring tips for both signal components can be used. The power of these individual signal components can be measured separately in a single power sensor 1 for each of the signal components.

The power sensor mount 14 as well as the optional calibration standard unit mount 20 are auxiliary chucks of a wafer prober.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate with the processor through a variety of known means.

The invention is not limited to the examples. The characteristics of the exemplary embodiments can be used in any combination.

Although the present invention and its advantages have been described in detail, it should be understood, that various changes, substitutions and alterations can be made herein without departing from the spirit and scope of the invention as defined by the appended claims.

What is claimed is:

1. A measuring system for performing measurements on a device under test, comprising a measuring device, a probe connected to the measuring device, a power sensor, a positioning unit, and a control unit,
   wherein the positioning unit is adapted to connect the probe to the power sensor in a first configuration and to the device under test in a second configuration,
   wherein the measuring device is adapted to generate a first signal,
   wherein the probe is adapted to:
      supply the first signal to the power sensor in the first configuration,
      supply the first signal to the device under test in the second configuration,
      determine the power supplied to the measuring device directly at a planar interface on a wafer,
   wherein the control unit is adapted to control function of the measuring device, the positioning unit and the power sensor,
   wherein the control unit is adapted to coordinate movement of a power sensor mount, a device under test mount and a calibration standard unit mount, performing of the power measurement by the power sensor, and the performing of the measurement by the measurement device on the device under test,
   wherein the control unit is adapted to perform calibration measurements by the measuring device on calibration standards of a calibration standard unit, and
   wherein the positioning unit is adapted to jointly move the device under test mount, the calibration standard unit mount and the power sensor mount with respect to the probe, thereby connecting the probe to the power sensor in the first configuration, and to the device under test in the second configuration and a plurality of calibration standards from the calibration standards unit in further configurations.

2. The measuring system of claim 1,
   wherein the power sensor is adapted to determine the power of the first signal in the first configuration, and
   wherein the measuring device is adapted to regulate the power of the first signal in the second configuration based upon the power determined by the power sensor.

3. The measuring system of claim 1,
   wherein the power sensor comprises coplanar contacts,
   wherein the probe is adapted to contact the coplanar contacts of the power sensor in the first configuration, and
   wherein the probe is adapted to contact coplanar contacts of the device under test in the second configuration.

4. The measuring system of claim 1,
   wherein the measuring device is adapted to perform the calibration of the power of the first signal to a pre-specified power value using the probe and the power sensor while being in the first configuration, and
   wherein the measuring device is adapted to perform a measurement of a second signal generated by the device under test as a reaction to the first signal using the probe in the second configuration.

5. The measuring system of claim 1,
   wherein the measuring system comprises a device under test mount for holding the device under test, and a power sensor mount for holding the power sensor, and
   wherein the probe is mounted at a fixed location.

6. The measuring system of claim 5,
   wherein the probe comprises at least two, especially two or three or four or five measuring tips,
   wherein the power sensor comprises at least two, especially two or three or four or five contact pads,
   wherein the positioning unit is adapted to jointly move the device under test mount and the power sensor mount for connecting the at least two measuring tips of the probe each to one of the at least two contact pads of the power sensor in the first configuration, and for connecting the at least two measuring tips of the probe each to one of the at least two contact pads of the device under test in the second configuration.

7. The measuring system of claim 5,
   wherein the measuring system comprises at least one further probe, which is adapted to be interchangeably mounted instead of said probe,
   wherein said probe has a first measuring tip pitch and the at least one further probe has a second measuring tip pitch different from the first measuring tip pitch,
   wherein the measuring system comprises at least one further power sensor, which is adapted to be interchangeably mounted instead of said power sensor,
   wherein said power sensor has a first contact pad pitch and the at least one further power sensor has a second contact pad pitch different from the first contact pad pitch,
   wherein the first measuring tip pitch is compatible to the first contact pad pitch and the second measuring tip pitch is compatible to the second contact pad pitch, and
   wherein the measuring system is adapted to be adaptive to different contact pad pitches of contact pads of the device under test by mounting the probe or the at least one further probe and by mounting the power sensor or the further power sensor.

8. The measuring system of claim 1,
   wherein the measuring system comprises the calibration standard unit comprising a set of calibration standards,
   wherein the positioning unit is adapted to connect the probe successively to the plurality of calibration standards from the set of the calibration standards in further configurations,
   wherein the probe is adapted to successively supply calibration signals to the plurality of calibration standards in the further configurations, and
   wherein the measuring device is adapted to
      perform calibration measurements of signals received from the plurality of calibration standards, and perform the calibration of the measuring device based upon the measurements of the signals received from the plurality of calibration standards.

9. The measuring system of claim 8,
wherein the measuring system comprises a device under test mount for holding the device under test, a power sensor mount for holding the power sensor, and the calibration standard unit mount for holding the calibration standard unit,
wherein the probe is mounted at a fixed location,
wherein the positioning unit is adapted to jointly move the device under test mount, the power sensor mount and the calibration standard unit mount for connecting the probe to the power sensor in the first configuration, to the device under test in the second configuration, and to the plurality of calibration standards in the further configurations.

10. A measuring method for performing measurements on a device under test, comprising:
connecting a probe to a power sensor in a first configuration,
generating a first signal by a measuring device,
supplying the first signal to a power sensor,
determining the power of the first signal in the first configuration by the power sensor,
connecting the probe to the device under test in a second configuration,
generating the first signal,
supplying the first signal to the device under test,
regulating the power of the first signal in the second configuration based upon the power determined by the power sensor,
determining the power supplied to the measuring device directly at a planar interface on a wafer,
controlling the function of the measuring device, the positioning unit, and the power sensor by a control unit, which is adapted to coordinate movement of a power sensor mount, a device under test mount and a calibration standard unit mount, and performing of the power measurement of the power sensor by a control unit,
performing the measurement by the measurement device on the device under test, and performing calibration measurements by measuring on calibration standards of a calibration standard unit by the control unit, and
adapting the positioning unit to jointly move the device under test mount, the calibration standard unit mount and the power sensor mount with respect to the probe, thereby connecting the probe to the power sensor in the first configuration, and to the device under test in the second configuration and a plurality of calibration standards from the calibration standard unit in further configurations.

11. The measuring method of claim 10,
wherein coplanar contacts of the power sensor are contacted by the probe in the first configuration, and
wherein coplanar contacts of the device under test are contacted by the probe in the second configuration.

12. The measuring method of claim 10,
wherein the method comprises
performing the calibration of the power of the first signal to a pre-specified power value using the probe and the power sensor while in the first configuration, and
measuring a second signal generated by the device under test as a reaction to the first signal using the probe in the second configuration.

13. The measuring method of claim 10,
wherein the method comprises
mounting the probe at a fixed location,
holding the device under test in a device under test mount,
holding the power sensor in a power sensor mount, and
jointly moving the device under test mount and the power sensor mount for connecting the probe to the power sensor in the first configuration, and to the device under test in the second configuration.

14. The measuring method of claim 13,
wherein the probe comprises at least two, especially two or three or four or five measuring tips,
wherein the power sensor comprises at least two, especially two or three or four or five contact pads,
wherein the method comprises jointly moving the device under test mount and the power sensor mount for connecting the at least two measuring tips of the probe each to one of the at least two contact pads of the power sensor in the first configuration, and for connecting the at least two measuring tips of the probe each to one of at least two contact pads of the device under test in the second configuration.

15. The measuring method of claim 13,
wherein at least one further probe is interchangeably mountable instead of said probe,
wherein said probe has a first measuring tip pitch and the at least one further probe has a second measuring tip pitch different from the first measuring tip pitch,
wherein at least one further power sensor is interchangeably mountable instead of said power sensor,
wherein said power sensor has a first contact pad pitch and the at least one further power sensor has a second contact pad pitch different from the first contact pad pitch,
wherein the first measuring tip pitch is compatible to the first contact pad pitch and the second measuring tip pitch is compatible to the second contact pad pitch, and
wherein the measuring method comprises adapting to different contact pad pitches of contact pads of the device under test by mounting said probe or the at least one further probe and by mounting the power sensor or the at least one further power sensor.

16. The measuring method of claim 10,
wherein the method additionally comprises:
connecting the probe successively to the plurality of calibration standards from a set of calibration standards of the calibration standard unit in further configurations,
successively supplying calibration signals to the plurality of calibration standards in the further configurations,
performing the calibration measurements of signals received from the plurality of calibration standards, and
performing the calibration of the measuring device based on the measurements of the signals received from the plurality of calibration standards.

17. The measuring method of claim 16,
wherein the method additionally comprises:
holding the device under test by a device under test mount,
holding the power sensor by a power sensor mount,
holding the calibration standard unit by the calibration standard unit mount, and
mounting the probe at a fixed location.

* * * * *